(12) United States Patent
Meyer et al.

(10) Patent No.: US 10,929,589 B1
(45) Date of Patent: Feb. 23, 2021

(54) GENERATING ROUTING STRUCTURE FOR CLOCK NETWORK BASED ON EDGE INTERSECTION DETECTION

(71) Applicant: Cadence Design Systems, Inc., San Jose, CA (US)

(72) Inventors: Dirk Meyer, Elsworth (GB); Zhuo Li, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/823,998

(22) Filed: Mar. 19, 2020

(51) Int. Cl.
*G06F 30/00* (2020.01)
*G06F 30/396* (2020.01)
*G06F 30/394* (2020.01)
*G06F 30/31* (2020.01)

(52) U.S. Cl.
CPC ............ *G06F 30/396* (2020.01); *G06F 30/31* (2020.01); *G06F 30/394* (2020.01)

(58) Field of Classification Search
CPC ....... G06F 30/396; G06F 30/394; G06F 30/31
See application file for complete search history.

(56) References Cited

U.S. PATENT DOCUMENTS

| | | | | |
|---|---|---|---|---|
| 5,410,491 A | * | 4/1995 | Minami | G06F 1/10 716/114 |
| 5,717,229 A | * | 2/1998 | Zhu | G06F 30/394 257/208 |
| 5,740,067 A | * | 4/1998 | Hathaway | G06F 30/327 716/113 |
| 6,910,195 B2 | | 6/2005 | Akkiraju | |
| 6,996,512 B2 | | 2/2006 | Alpert et al. | |
| 7,093,150 B1 | * | 8/2006 | Norman | G06F 1/10 713/400 |
| 7,127,696 B2 | | 10/2006 | Alpert et al. | |
| 7,181,709 B2 | * | 2/2007 | Tajika | G06F 1/10 716/114 |
| 7,366,941 B1 | * | 4/2008 | Norman | G06F 1/10 713/400 |
| 7,392,495 B1 | | 6/2008 | Cherukupalli et al. | |
| 7,809,971 B2 | | 10/2010 | Shimobeppu | |
| 8,006,213 B2 | * | 8/2011 | Berry | G06F 30/30 716/124 |
| 8,214,790 B2 | * | 7/2012 | Masleid | G06F 30/394 716/139 |
| 9,922,157 B1 | * | 3/2018 | Ebeling | G06F 30/398 |

(Continued)

OTHER PUBLICATIONS

Lee, C. Y., "An Algorithm for Path Connections and Its Applications", IRE Transactions on Electronics Computers, vol. EC-10, (Sep. 1961), 346-365.

(Continued)

*Primary Examiner* — Naum Levin
(74) *Attorney, Agent, or Firm* — Schwegman Lundberg & Woessner, P.A.

(57) ABSTRACT

Various embodiments provide for generating a routing structure for a clock network based on edge interaction detection, which can facilitate detection/consideration of overuse of routing resources to a balanced routing structure and which may be part of electronic design automation (EDA) of a circuit design. For example, some embodiments use an edge intersection check to detect overuse of routing resources within the routing structure for a clock network.

20 Claims, 11 Drawing Sheets

(56) References Cited

U.S. PATENT DOCUMENTS

| | | | |
|---|---|---|---|
| 10,289,795 B1 | 5/2019 | Gao et al. | |
| 10,333,535 B1* | 6/2019 | Mendel | H03L 7/07 |
| 10,643,014 B1* | 5/2020 | Meyer | G06F 30/398 |
| 10,706,202 B1* | 7/2020 | Meyer | G06F 30/347 |
| 2006/0184906 A1* | 8/2006 | Aizawa | G06F 30/392 |
| | | | 716/113 |
| 2012/0240090 A1* | 9/2012 | Shirai | G06F 30/394 |
| | | | 716/113 |

OTHER PUBLICATIONS

Uttraphan, Chessda, et al., "An optimized buffer insertion algorithm with delay-power constraints for VLSI layouts", Turkish Journal of Electrical Engineering and Computer Sciences, vol. 25, (Jan. 2017), 844-861.

* cited by examiner

GENERATING ROUTING STRUCTURE FOR CLOCK NETWORK BASED ON EDGE INTERSECTION DETECTION

TECHNICAL FIELD

Embodiments described herein relate to circuit design and, more particularly, to systems, methods, devices, and instructions for generating a routing structure for a clock network based on edge interaction detection, which may be part of electronic design automation (EDA).

BACKGROUND

Electronic design automation (EDA) is a category of systems for assisting with the design of electronic systems and devices. Traditional EDA systems include generation of a clock tree structure (or clock tree) for a clock network, where the clock tree uses a branching network to distribute a clock signal from a clock signal source (hereafter, clock source) to a plurality of clock signal destinations (hereafter, clock sinks) within a circuit design.

BRIEF DESCRIPTION OF THE DRAWINGS

Various ones of the appended drawings merely illustrate various embodiments of the present disclosure and should not be considered as limiting its scope.

DETAILED DESCRIPTION

Figure 1:
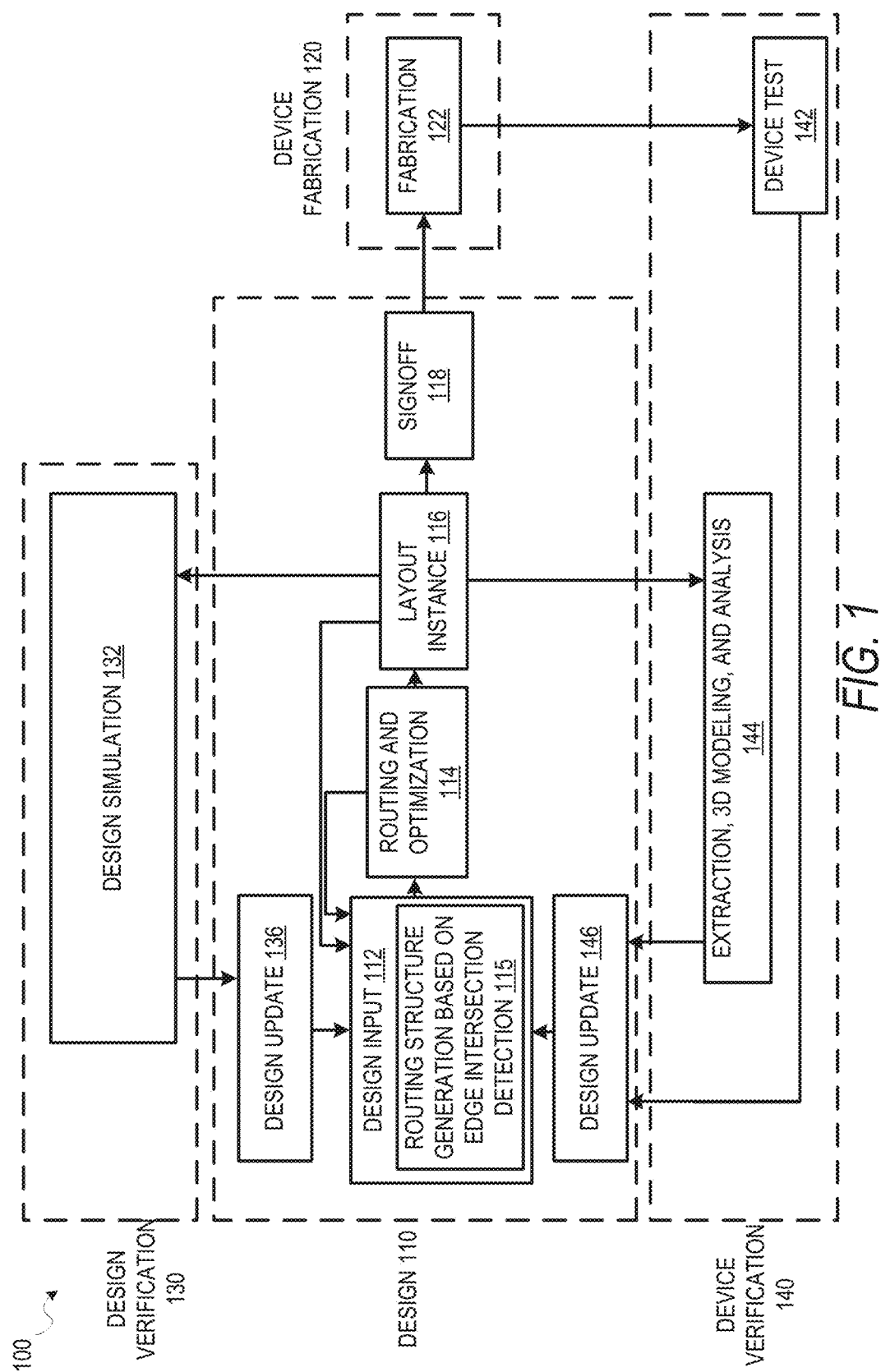
FIG. 1 is a diagram illustrating an example design process flow for generating a routing structure for a clock network based on edge intersection detection, according to some embodiments.

As noted herein, an EDA software system commonly performs generation of a clock tree structure (or clock tree) for a clock network, where the clock tree uses a branching network to distribute a clock signal from a clock source to a plurality of clock sinks within a circuit design. A clock tree, for example, can comprise a single clock source and can be coupled to hundreds or thousands of clock sinks. The clock sinks usually comprise clock sinks in the circuit design that require a clock signal to operate, such as flip-flops. The branching network forming the circuit is comprised of nodes connected by nets.

One style for clock-tree design is to have a portion of the clock-tree be highly structured. This highly structured portion is given preferential circuit resources so that it may have improved performance, power or yield attributes. Examples of such structured circuits are H-trees, meshes and fishbones. The design of the clock tree can have limits on the amount of time a clock signal can take to get to the furthest clock sink (e.g., a maximum arrival time) as well as limits on the differences between arrival times at various clock sinks and limits on the total wavelength in the clock tree. The specific layout of the clock tree can be set based on various "costs" associated with different layout elements, such as length mismatches, routing turns, or other physical layout characteristics that degrade performance.

Traditionally, balanced routing structures, such as H-trees, are often implemented in a clock network using wide, possibly shielded, wires on high metal layers to reduce wire resistance, which in turn can reduce the clock latency. However, the routing resources on these high metal layers are often sparse and may also need to be shared with power routing and other signal routing (which are usually blocked out during the routing process). As a result, during clock tree generation, it is important to carefully consider available resources to avoid the overuse of routing resources. If such resource overuse is not mitigated, detailed routing operations using conflict resolutions, such as route jogging and non-preferred layer usage, to address the resource overuse, which in turn can result in a clock network that is inferior or that has failing results. Unfortunately, detailed consideration of routing resources traditionally takes place later in the clock tree generation process (e.g., at a local level), when it is often not possible to solve routing conflicts without degrading the overall results of the clock network. For example, it can be difficult to fix resource overuse by local optimization in post-processing step without affecting quality-of-result (QoR).

Various embodiments described herein provide for generating a routing structure for a clock network based on edge interaction detection, which can facilitate detection/consideration of overuse of routing resources to a balanced routing structure and which may be part of electronic design automation (EDA) of a circuit design. More particularly, some embodiments use an edge intersection check to detect overuse of routing resources within the routing structure for a clock network. Additionally, for some embodiments, an edge intersection check is performed in connection with determining (e.g., selecting) locations for branch points (e.g., from a set of candidate locations) for substructures in the routing structure. Various embodiments result in a routing structure (e.g., clock tree) that is balanced.

According to various embodiments, the edge intersection is performed during in a bottom-up (e.g., clock sink-up) traversal (e.g., analysis and generation) of the routing structure. Eventually, the location of the top-most branch point (i.e., the root) of the routing structure (e.g., of the clock tree) is reached, the top-most branch point can be adjusted when it is coupled (e.g., connected) to a clock source for the balanced routing structure. By the bottom-up traversal of the routing structure, a branch point location can be determined (e.g., selected) recursively in substructures (e.g., subtrees) of the routing structure such that edge intersections are avoided as the routing structure is generated. As noted herein, avoidance of edge intersections can assist in avoiding overuse of routing resources (e.g., routing overflow) as the routing structure is generated. For some embodiments, an edge intersection check is implemented as part of a branch point cost function used in determining locations for branch points for substructures in the routing structure. According to various embodiments, in response to an edge intersection check determining that at least one intersection is found in a substructure of the routing structure, one or more branch points of a previous level are adjusted or a different location for the one or more branch points at the current level are selected to avoid edge intersections. Minimal cost (e.g., via the branch point cost function) determines which of the two options is used in the routing structure.

By use of various embodiments, routing resource awareness can be added to generation of a balance routing structure (e.g., balanced clock tree structure) and can be added to such that one or more routing resources are automatically considered during the clock network (e.g., clock tree) generation flow. In doing so, resource overuse can be mitigated during generation of a balanced routing structure for a clock network, and certain resource conflict resolutions (e.g., jogging or non-preferred layer usage by detailed routing) can be avoided in the balanced routing structure. Additionally, use of various embodiments can help avoid fixing resource overuse by local optimization, which is known to affect the quality of the circuit design (e.g., QoR) detrimentally. In comparison to micro-level solution to resource overuse provided by local optimization, various embodiments described herein can provide for a macro-level solution to resource overuse.

Although various embodiments are described herein with respect to edge-based interaction detection, for some embodiments, a rectangle-based intersection detection is used (in place of the edge intersection detection), where the rectangles are associated with a grid (e.g., a placement grid, such as GCELL grid) used in generation of the circuit design. Use of a rectangle-based intersection can allow some embodiments to cover intersection detection of several tracks in parallel.

As described herein, a "clock sink" for a particular level of a routing structure (e.g., routing tree or clock tree structure) can refer to a branch point selected to connect a clock sink or a branch point from a previous level of a routing structure, or refer to an endpoint of the routing structure (e.g., leaves of a structured portion of a clock tree, such an H-tree), which can couple to an actual clock sink component (e.g., flip-flop, or buffer) or a clock gate between a structure and unstructured portion of a clock tree within the circuit design. As used herein, a branch point candidate can refer to a given branch point of a substructure (e.g., subtree) at a candidate location for that given branch point (i.e., each branch point candidate refers to the given branch point at a different candidate location).

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 for generating a routing structure for a clock network based on edge intersection detection, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. During the design input 112 operation, initial layouts for a routing structure for a clock network (e.g., balanced clock tree structure) and clock sinks can be generated. For example, following an initial selection of design values in design input 112 operation, a routing structure (e.g., routing tree) can be generated based on edge intersection detection, in accordance with various embodiments described herein. The initial strategy, tactics, and context for the device to be created are also generated in the design input 112 operation, depending on the particular design algorithm to be used.

As shown, the design input 112 operation includes a routing structure generation based on edge intersection detection 115 operation (hereafter, the routing structure generation 115 operation), which can be performed in accordance with various embodiments described herein. During the routing structure generation 115 operation, a routing structure can be generated for a clock network based on edge intersection detection. Though illustrated as being part of the design input 112 operation, depending on the embodiment, the routing structure generation 115 operation can be performed during the routing and optimization 114 operation or during layout instance 116 operation.

In some embodiments, following an initial selection of design values in the design input 112 operation, routing, timing analysis, and optimization are performed in a routing and optimization 114 operation, along with any other automated design processes. The routing and optimization 114 operation may also include other operations not shown, such as those relating to floorplanning, placement, post-placement optimization, and post-routing optimization.

While the design process flow 100 shows optimization occurring prior to a layout instance 116, timing analysis and optimization may be performed at any time to verify operation of a circuit design. For instance, in various embodiments, timing analysis in a circuit design may be performed prior to routing of connections in the circuit design; after routing, during register transfer level (RTL) operations; or as part of a signoff 118, as described below.

Design inputs are used in the design input 112 operation to generate an initial circuit layout. The design inputs may be further processed during the design input 112 operation via a process, such as logic-synthesis to generate a circuit netlist mapped to a target standard library manufacturable by the foundry in a fabrication 122 operation. After design inputs are used in the design input 112 operation to generate an initial circuit layout, and any of the routing and optimization 114 operations are performed, a resulting layout is generated as the layout instance 116. The netlist as placed by the layout instance 116 describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or extraction, 3D modeling, and analysis 144 operations. Once the device is generated, the device can be tested as part of device test 142 operations and layout modifications generated based on actual device performance.

As described in more detail below, a design update 136 from the design simulation 132 operations; a design update 146 from the device test 142 operations or the extraction, 3D modeling, and analysis 144 operations; or the design input 112 operation may occur after the initial layout instance 116 is generated. In various embodiments, whenever design inputs are used to update or change an aspect of a circuit design, a timing analysis and the routing and optimization 114 operation may be performed.

Figure 2:
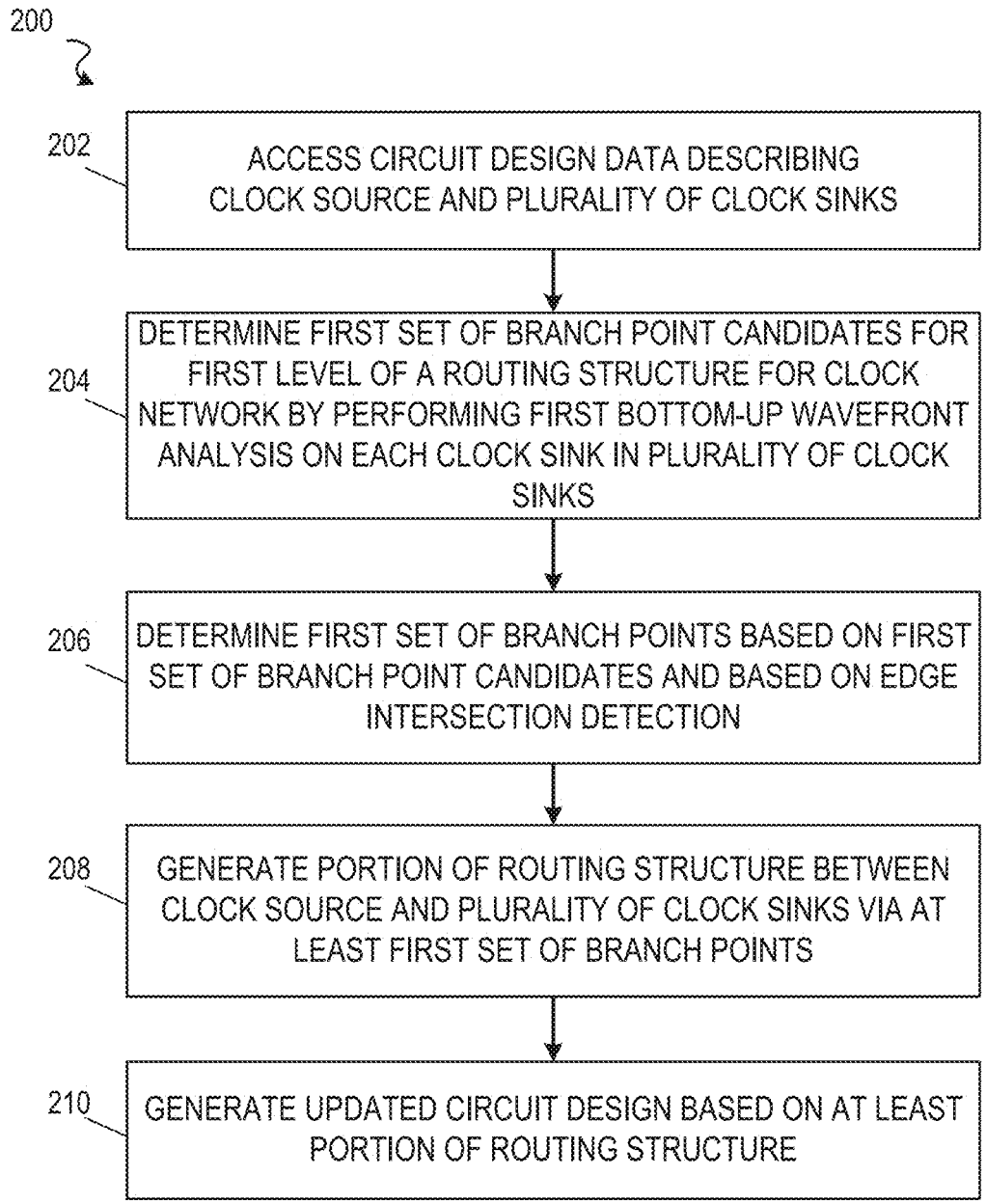
FIGS. 2 and 3 are flowcharts illustrating example methods for generating a routing structure for a clock network based on edge intersection detection, according to some embodiments.
Figure 3:
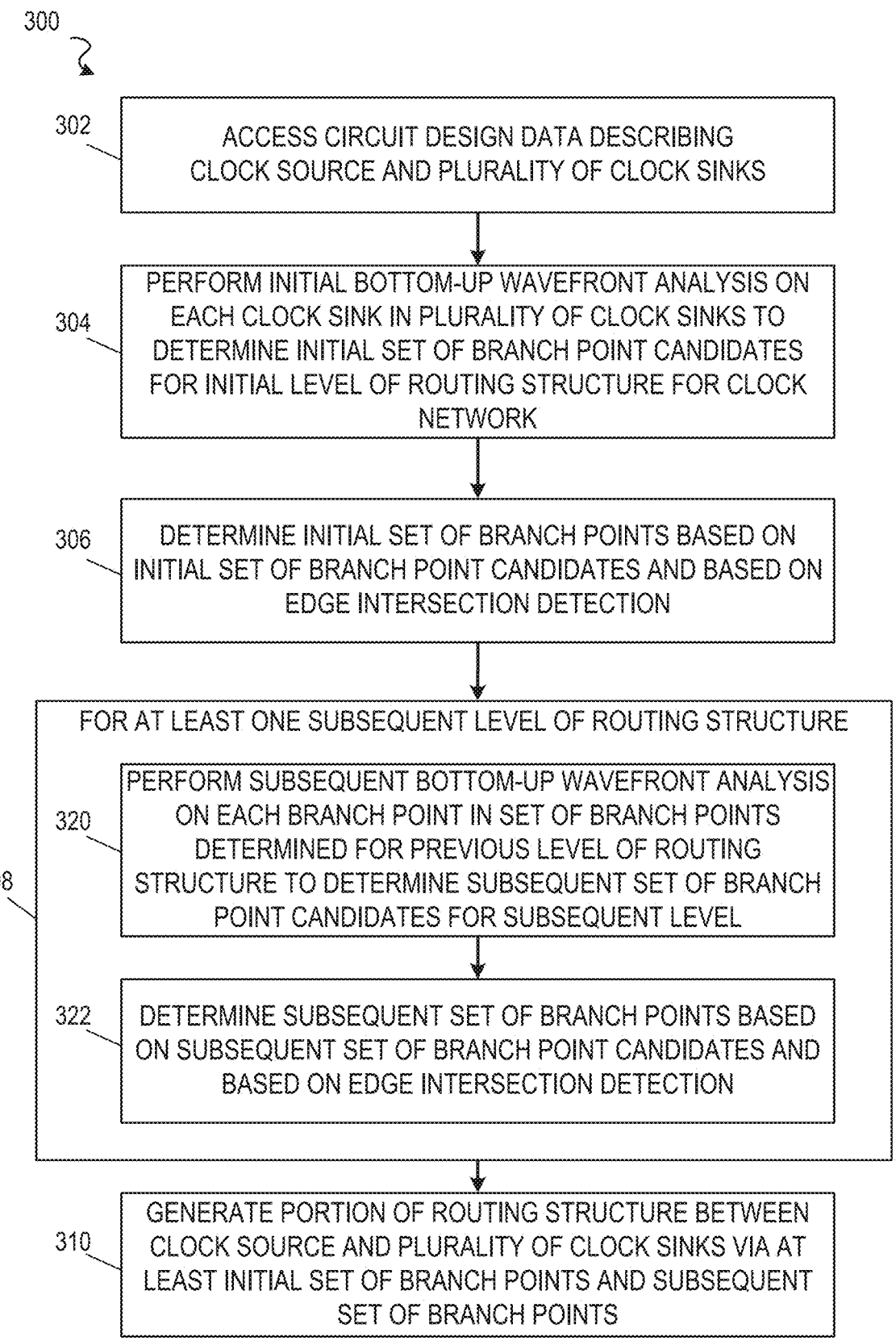

FIGS. 2 and 3 are flowcharts illustrating example methods for generating a routing structure for a clock network based on edge intersection detection, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For instance, the operations of a method 200 of FIG. 2 may be represented by executable instructions that, when executed by a processor of a computing device, cause the computing device to perform the method 200. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

Referring now to FIG. 2, the flowchart illustrates the example method 200 for generating a routing structure for a clock network based on edge intersection detection, according to some embodiments. For some embodiments, one or more operations of the method 200 are performed as part of a clock tree synthesis (CTS) process or a global routing process performed with respect to a circuit design (e.g., by an EDA software system). An operation of the method 200 (or another method described herein) may be performed by a hardware processor (e.g., central processing unit or graphics processing unit) of a computing device (e.g., desktop, server, etc.).

As illustrated, at operation 202, circuit design data is accessed, where the design data describes a clock source and a plurality of clock sinks for a circuit design. According to various embodiments, the circuit design data is accessed to in order to generate a routing structure (e.g., clock tree for a circuit design). The circuit design data can comprise additional information, such as grid layout information (e.g., GCELL data), which can include information on blockages (e.g., which allow routing but do not allow object or buffer placement) and obstructions (e.g., which do not allow any placement including routing and objects). Thereafter, operation 204 determines a first set of branch point candidates for a first level of a routing structure for a clock network by performing a first bottom-up wavefront analysis on each clock sink in the plurality of clock sinks. For some embodiments, the routing structure can comprise a clock tree structure (or clock tree), such as an H-tree.

For some embodiments, performing the bottom-up wavefront analysis on each clock sink comprises performing a bottom-up wavefront expansion on each clock sink. The bottom-up wavefront expansion can be performed in a variety of different ways. For example, a wavefront can be set for each clock sink. The shape of the waveform for each sink can be the same at each step of the wavefront expansion. The initial small wavefronts are unlikely to overlap given standard clock sink structures. As the waveforms for each clock sink grows larger and larger together, the wavefronts will eventually overlap. When the wavefronts for two clock sinks overlap, the overlap or touching areas and areas around these spaces can be identified as branch point candidates. The wavefront intersections can be a way of identifying the halfway points of electrical distances between clock sinks. If the intersection of two wavefronts is in a space where there is a known blockage from other circuit elements, the wavefront expansion can continue until all wavefront intersection points outside of the blockage are identified. At each level or tier of a routing structure (e.g., routing tree) of a clock network, the bottom-up wavefront expansion can be performed until each clock sink is associated with a set of branch point candidates.

A wavefront expansion can be structured as a set of wavefront data structures, with one wavefront data structure for each initial point (e.g., each clock sink in the first level, or each branch points from a previous level for a subsequent level after the first level of the routing structure). As described herein, a "clock sink" for a particular level of a routing structure (e.g., routing tree) can refer to a branch point selected to connect a clock sink or a branch point from a previous level of a routing structure, or refer to an endpoint of the routing structure (e.g., leaves of a structured portion of a clock tree, such an H-tree). The wavefronts can expand out from the initial points at the same rate until they collide. As they expand, the wavefronts can be annotated with information such as the accumulated net length, repeater levels, and the distance to the point where a placement blocked area was entered. For some embodiments, the information comprises data describing links to branch points and turns in the routing structure (e.g., in subtree of a routing tree). Other information, such as the minimum number of turns and the distance from the last branch point, can be recorded. The wavefronts originating from each initial point (e.g., sink or prior level branch point) can be expanded until the wavefronts "collide" with wavefronts from other clock sinks, which gives a set of locations for branch point candidates, which can be selected as branch points in resulting routing structure (e.g., clock tree structure). The expansion of the wavefronts continues past the initial collisions until sufficient branch point pair candidates have been found or an expansion limit is reached.

Next, operation 206 determining a first set of branch points based on the first set of branch point candidates (determined by operation 204) and based on edge intersection detection. For some embodiments, the determining the first set of branch points based on the first set of branch point candidates and based on edge intersection detection comprises applying a branch point cost function to the first set of branch point candidates (e.g., to each branch point candidate in the first set), where applying the branch point cost function to the first set of branch point candidates (e.g., to each branch point candidate) comprises adjusting a cost of a given branch point candidate, in the first set of branch point candidates, based on edge intersection detection. For various embodiments, by applying the branch point cost function to each branch point candidate in a set of branch point candidates, the branch point cost function enables branch point candidates within the set to be compared against each other to select a branch point. As a result of applying the branch point cost function (where the cost of a branch point candidate can be adjusted based on edge intersection detection as described herein), a branch point at a current level of a routing structure can be adjusted or a branch point at a previous level of the routing structure can be adjusted to avoid an edge intersection.

For some embodiments, adjusting the cost of a given branch point candidate based on edge intersection detection comprises detecting for at least one edge intersection in a first substructure (e.g., first subtree) of the routing structure (e.g., clock tree) coupled to the given branch point candidate. For various embodiments, detection of the edge intersection in the first substructure coupled comprises determining a set of edges (e.g., horizontal or vertical edges) for the first substructure, sorting the set of edges, and based on the sorted set of edges, detecting for a set of edge intersections in the first substructure. According to some embodiments, determining the set of edges for the first substructure comprises extracting edge data from wavefront data, where the wavefront data is generated by the first bottom-up wavefront analysis performed on each clock sink in the plurality of clock sinks (e.g., at operation 204). The wavefront data can comprise (e.g., store), for example, data regarding one or more connections between edges at routing turns within a substructure of the routing structure, or data regarding one or more connections to branch points within the substructure. Additionally, the data within the wavefront data can be stored in a top-down arrangement.

For some embodiments, in response to detecting at least one edge intersection in the first substructure, the cost of the given branch point candidate is adjusted, which can facilitate avoidance of edge intersections in the first substructure when the first substructure is generated. For some embodiments, the cost of the given branch point candidate is adjusted such that the given branch point candidate is rendered less desirable for selection (e.g., less likely to be selected) as a branch candidate. For instance, the cost of the given branch point candidate can be increased according to a high cost component (e.g., a high cost component is added to the cost of the given branch point candidate).

For some embodiments, in response to not detecting at least one edge intersection in the first substructure, at least one edge intersection is detected for in a second substructure of the routing structure coupled to the given branch point candidate. In response to detecting at least one edge intersection in the second substructure, the cost of the given branch point candidate can be adjusted (e.g., increasing the cost of the given branch point candidate according to a high cost component). Alternatively, in response to not detecting at least one edge intersection in the second substructure, at least one edge intersection is detected for between an edge of the first substructure and an edge of the second substructure. In response to detecting at least one edge intersection between the edge of the first substructure and the edge of the second substructure, the cost of the given branch point candidate can be adjusted (e.g., increasing the cost of the given branch point candidate according to a high cost component). In response to detecting at least one edge intersection between the edge of the first substructure and the edge of the second substructure, the cost of the given branch point candidate can remain unchanged by operation 206.

For some embodiments, the adjustment of the cost of the given branch point candidate (based on edge intersection detection) is performed in response to (e.g., only in response to) determining that any other cost component (e.g., all other cost components) being considered by the branch point cost function for the given branch point candidate is low in view of an efficiency threshold. For example the efficiency threshold can be determined or adjusted to ensure that the edge insertion detection is performed under select conditions. By performing the edge insertion detection under select conditions (e.g., when cost components are low), the expense of performing the edge insertion detection can be avoided when select conditions are not met, which can ensure efficient use of the edge intersection detection process. For some embodiments, the edge intersection detection process can be regarded as an expensive process to perform, especially when the cost of the given branch point candidate is already high due to one or more other factors considered by the branch point cost function.

The method 200 continues with operation 208 generating a portion of the routing structure between the clock source and the plurality of clock sinks via at least the first set of branch points determined by operation 206. Subsequently, at operation 210, an updated circuit design can be generated based on at least the portion of the routing structure generated by operation 208.

Referring now to FIG. 3, the flowchart illustrates the example method 300 for generating a routing structure for a clock network based on edge intersection detection, according to some embodiments. For some embodiments, one or more operations of the method 300 are performed as part of a clock tree synthesis (CTS) process or a global routing process performed with respect to a circuit design (e.g., by an EDA software system).

As illustrated, at operation 302, circuit design data is accessed, where the design data describes a clock source and a plurality of clock sinks for a circuit design. Thereafter, operation 304 performs an initial bottom-up wavefront analysis on each clock sink in the plurality of clock sinks to determine an initial set of branch point candidates for an initial level of a routing structure for a clock network.

At operation 306, an initial set of branch points is determined based on the initial set of branch point candidates (determined by operation 304) and based on edge intersection detection. For some embodiments, determining the initial set of branch points based on the initial set of branch point candidates and based on edge intersection detection comprises applying a branch point cost function to the initial set of branch point candidates (e.g., to each branch point candidate in the initial set), where applying the branch point cost function to the initial set of branch point candidates comprises adjusting a cost of a given branch point candidate, in the initial set of branch point candidates, based on edge intersection detection.

The method 300 continues with operation 308, where operations 320 and 322 are performed for at least one subsequent level of the routing structure. For some embodiments, operations 320 and 322 are performed for each subsequent level of the routing structure until a top level of the routing structure is reached. Depending on the specific structure of the circuit design, any number of levels may be present in the circuit design and operations 320 and 322 can be repeatedly performed for each level. If operations 320 and 322 are repeatedly performed, they repeat until the final wavefront overlaps with the clock source (e.g., which can identify the route to the clock source from the last branch point(s)).

At operation 320, a subsequent bottom-up wavefront analysis is performed on each branch point, in a set of branch points determined for a previous level of the routing structure, to determine a subsequent set of branch point candidates for the subsequent level. Subsequently, at operation 322, a subsequent set of branch points is determined based on the subsequent set of branch point candidates (determined by operation 320) and based on edge intersection detection. For some embodiments, determining the subsequent set of branch points based on the subsequent set of branch point candidates and based on edge intersection detection comprises applying the branch point cost function to the subsequent set of branch point candidates (e.g., to each branch point candidate in the subsequent set), where applying the branch point cost function to the subsequent set of branch point candidates comprises adjusting a cost of another given branch point candidate, in the subsequent set of branch point candidates, based on edge intersection detection.

The method 300 continues with operation 310 generating a portion of the routing structure between the clock source and the plurality of clock sinks via at least the initial set of branch points (determined by operation 306) and the subsequent set of branch points (determined by operation 308). For some embodiments, operation 308 is performed after all routing via determined (e.g., selected) branch points have been identified.

Figure 4:
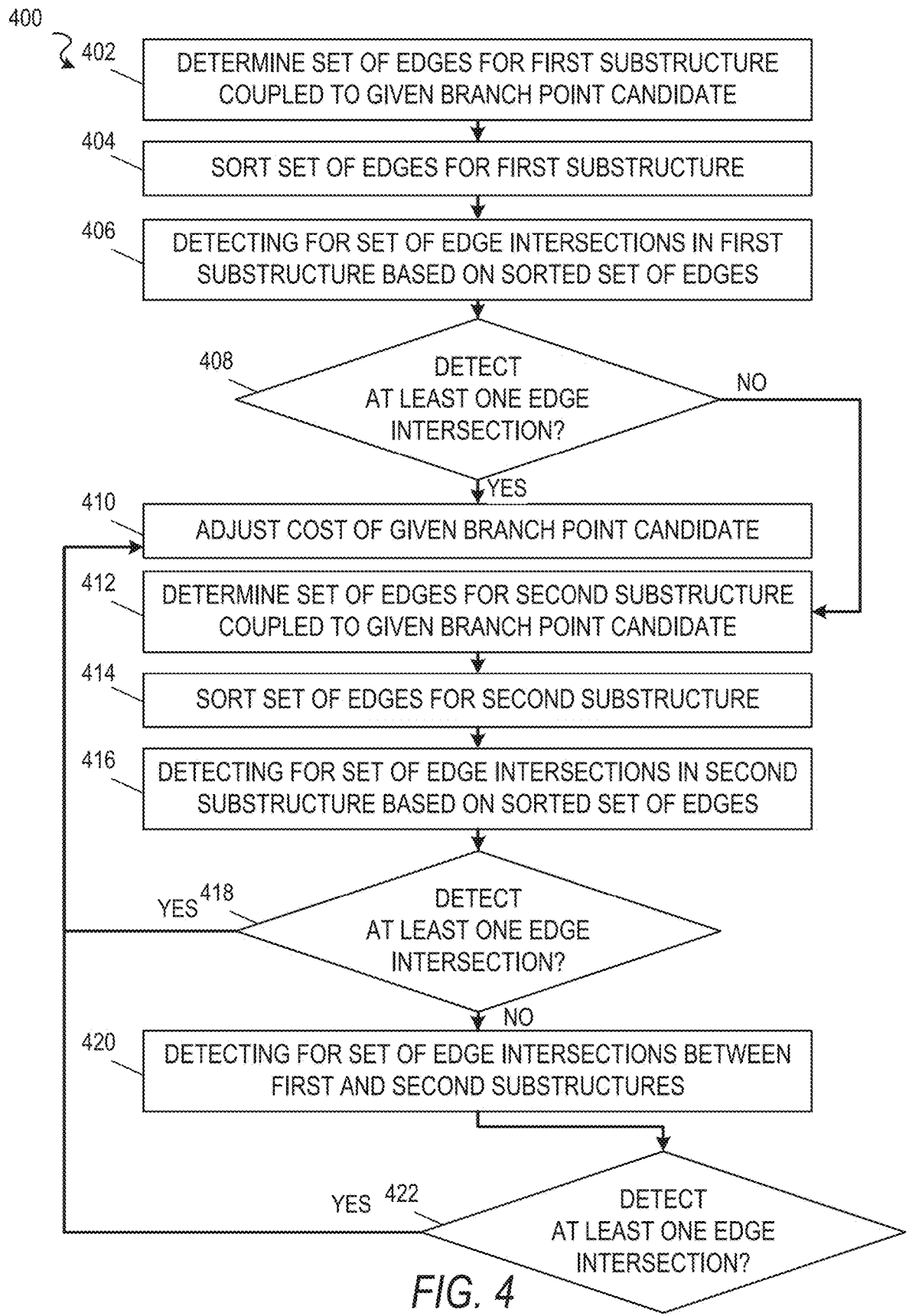
FIG. 4 is flowchart illustrating an example method for edge intersection detection, according to some embodiments.

FIG. 4 is flowchart illustrating an example method 400 for edge intersection detection, according to some embodiments. For some embodiments, one or more operations of the method 400 are used to perform edge intersection detection in the method 200 described above with respect to FIG. 2 (e.g., operation 206), or in the method 300 described above with respect to FIG. 3 (e.g., operations 306 or operation 322).

As illustrated, operation 402 determines a set of edges for a first substructure (e.g., first subtree) coupled to a given branch point candidate (e.g., from a set of branch point candidates). Subsequently, operation 404 sorts the set of edges (for the first substructure) determined by operation 402. Thereafter, operation 406 detects for a set of edge intersections in the first substructure based on the sorted set of edges produced by operation 404. Depending on the embodiment, operation 406 can use a variety of approaches to detect of the set of edge intersections in the first substructure based on the sorted set of edges, such as a scanline approach or a naive approach (e.g., check every edge with every other edge to detect for an edge intersection). At decision point 408, if at least one edge intersection is detected by operation 406, the method 400 proceeds to operation 410, otherwise the method 400 proceeds to operation 412.

Operation 412 determines a set of edges for a second substructure (e.g., second subtree) coupled to the given branch point candidate (e.g., from the set of branch point candidates). Subsequently, operation 414 sorts the set of edges (for the second substructure) determined by operation 412. Thereafter, operation 416 detects for a set of edge intersections in the second substructure based on the sorted set of edges produced by operation 414. As described herein, operation 416 can use a variety of approaches to detect of the set of edge intersections in the second substructure based on the sorted set of edges, such as a scanline approach or a naive approach. At decision point 418, if at least one edge intersection is detected by operation 416, the method 400 proceeds to operation 410, otherwise the method 400 proceeds to operation 420.

In response to not detecting at least one edge intersection at decision point 418, operation 420 detects for a set of edge intersection between the first and second substructures. At decision point 422, if at least one edge intersection is detected by operation 420, the method 400 proceeds to operation 410. If at least one edge intersection is not detected by operation 420, the method 400 can end (without an adjustment to the cost of the given branch point candidate).

At operation 410, the cost of the given branch point candidate is adjusted. For some embodiments, the cost of the given branch point candidate is adjusted such that the given branch point candidate is rendered less desirable for selection (e.g., less likely to be selected) as a branch candidate. For instance, operation 410 can comprise increasing the cost of the given branch point candidate according to a high cost component (e.g., by adding value associated with a high cost component to the cost of the given branch point candidate). For some embodiments, intersection lengths are summed up such that the total intersection length is used to compute the cost component. In some such embodiments, the method 400 can select a solution with the smallest total intersection length if an intersection cannot be avoided.

Figure 5:
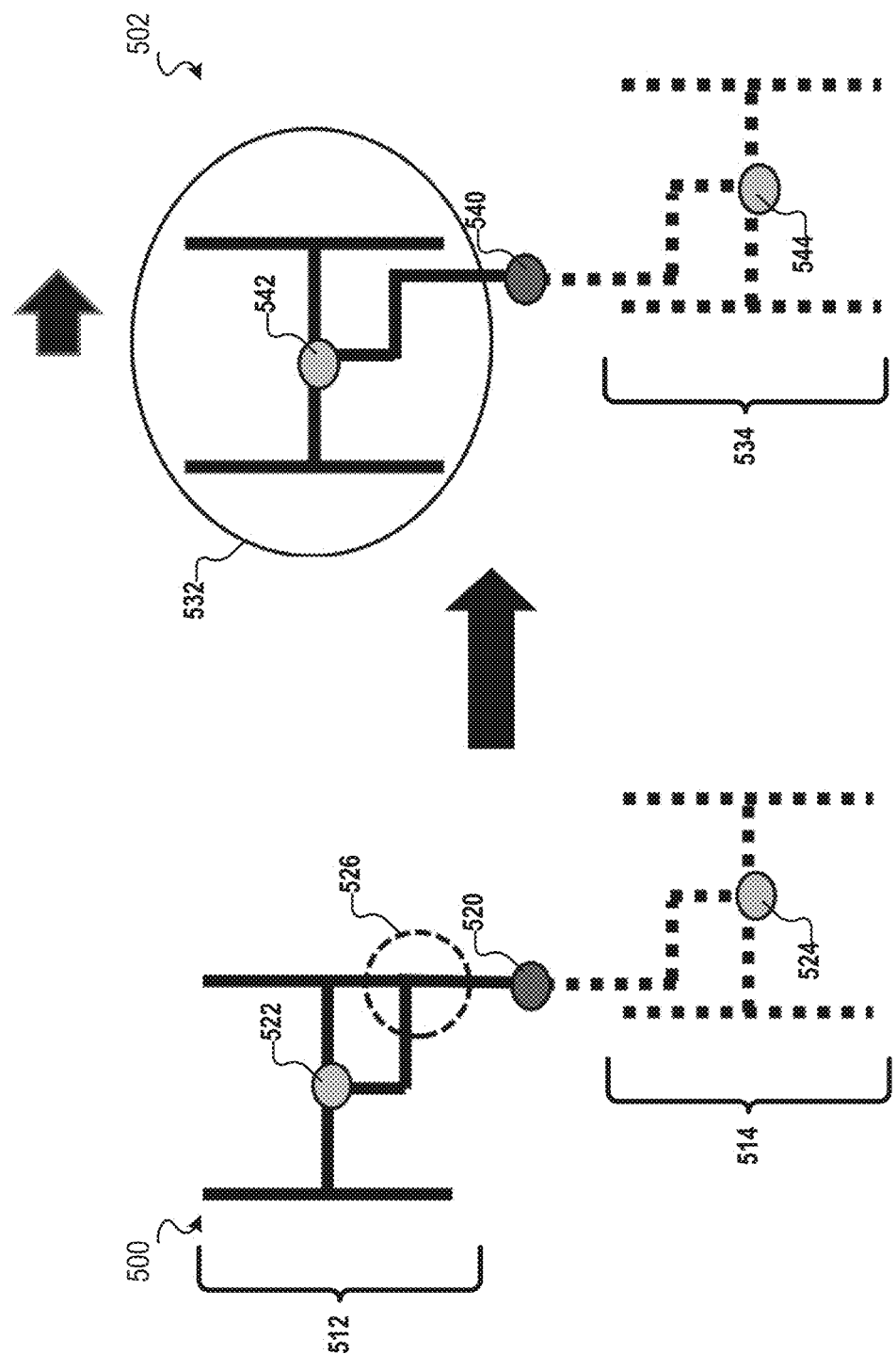
FIG. 5 illustrates an example routing structure for a clock network having an edge intersection in a single substructure and a corresponding example routing structure generated based on edge intersection detection, according to some embodiments.

FIG. 5 illustrates an example routing structure 500 for a clock network having an edge intersection in a single substructure (e.g., a single subtree) and a corresponding example routing structure 502 generated based on edge intersection detection, according to some embodiments. In particular, the routing structure 500 illustrates an example of a routing structure where clock sinks and branching points are positioned at ideal locations, but where an edge intersection exists in a single subtree, while the routing structure 502 illustrates an example of a routing structure that has been adjusted from ideal locations (based on edge intersection detection), but avoids edge intersections.

In FIG. 5, the routing structure 500 comprises a first subtree 512 and a second subtree 514, where a given branch point candidate 520 is associated with a current level of the routing structure 500, the branch point 522 represents a branch point selected at a previous level of the routing structure 500 for the first subtree 512, and the branch point 524 represents a branch point selected at a previous level of the routing structure 500 for the second subtree 514. As shown, an intersection between edges in the first subtree 512 exists at 526. As a result, the given branch point candidate 520, if selected, would result in the routing structure 500 having a resource conflict.

The routing structure 502, generated in accordance with various embodiments described herein, can avoid (or resolve) the resource conflict present in the routing structure 500. In particular, the routing structure 502 comprises a first subtree 532 and a second subtree 534, where a given branch point candidate 540 is associated with a current level of the routing structure 502, the branch point 542 represents a branch point selected at a previous level of the routing structure 502 for the first subtree 532, and the branch point 544 represents a branch point selected at a previous level of the routing structure 502 for the second subtree 534. As shown, compared to the first subtree 512 of the routing structure 500, the first subtree 532 resulting in the routing structure 502 is adjusted from its ideal locations (e.g., shifted to the right by a small amount from ideal locations), thereby avoiding (or resolving) the resource conflict (526) of the routing structure 500. Alternatively, the second subtree 534 could have been adjusted from ideal locations, or both the first and second subtrees 532, 534 could have been adjusted from ideal locations to avoid the resource conflict.

Figure 6:
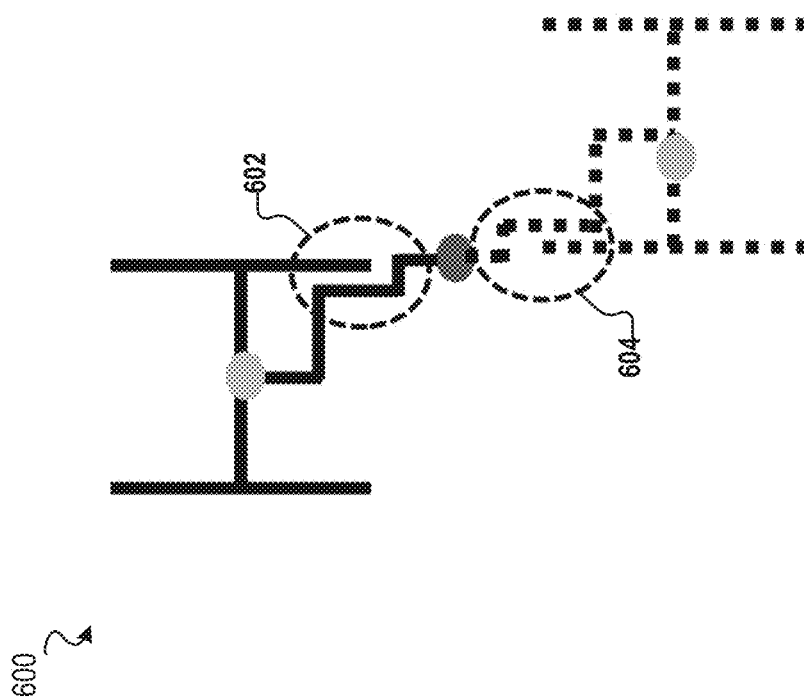
FIG. 6 illustrates an example routing structure for a clock network generated according to a traditional methodology.

For comparison purposes, FIG. 6 illustrates an example routing structure 600 corresponding to example routing structure 500 but generated by a traditional methodology, which can maintain ideal locations for clock sinks and branch points while avoiding (or resolving) the resource conflict (526) of the routing structure 500 by using local detours. Local detours within the routing structure typically comprise small deviations from ideal locations of clock sinks or branch points, such as those illustrated at 602 and 604 of the routing structure 600.

Figure 7:
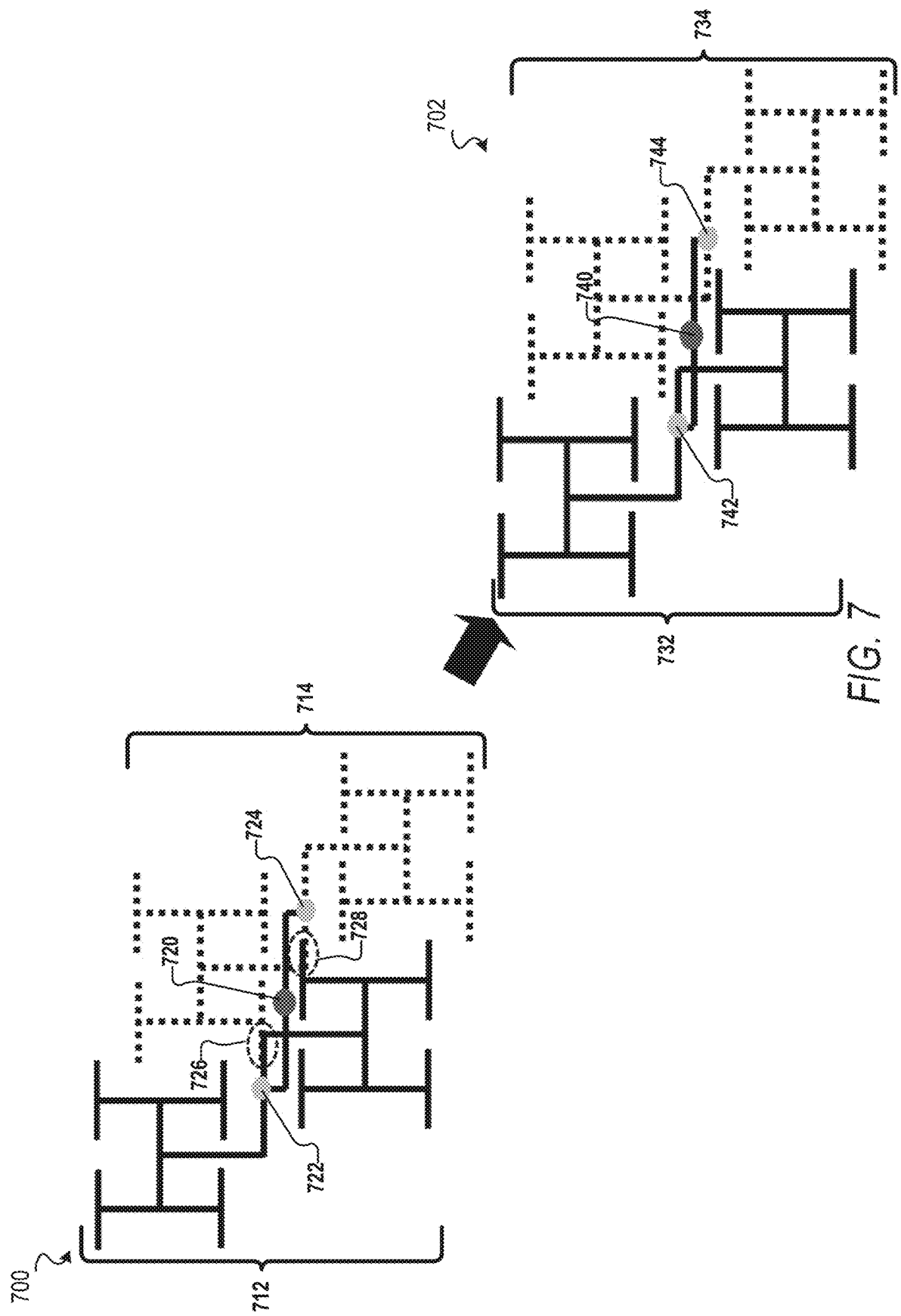
FIG. 7 illustrates an example routing structure for a clock network having an edge intersection in between different substructures and a corresponding example routing structure generated based on edge intersection detection, according to some embodiments.

FIG. 7 illustrates an example routing structure 700 for a clock network having an edge intersection in between different substructures (e.g., different subtrees) and a corresponding example routing structure 702 generated based on edge intersection detection, according to some embodiments. In particular, the routing structure 700 illustrates an example of a routing structure where clock sinks and branching points are positioned at ideal locations, but where an edge intersection exists between different subtree, while the routing structure 702 illustrates an example of a routing structure that has been adjusted from ideal locations (based on edge intersection detection), but avoids edge intersections.

In FIG. 7, the routing structure 700 comprises a first subtree 712 and a second subtree 714, where a given branch point candidate 720 is associated with a current level of the routing structure 700, the branch point 722 represents a branch point selected at a previous level of the routing structure 700 for the first subtree 712, and the branch point 724 represents a branch point selected at a previous level of the routing structure 700 for the second subtree 714. As shown, an intersection between edges of the first subtree 712 and the second subtree 714 exists at 726 and 728. As a result, the given branch point candidate 720, if selected, would result in the routing structure 700 having a resource conflict.

The routing structure 702, generated in accordance with various embodiments described herein, can avoid (or resolve) the resource conflicts present in the routing structure 700. In particular, the routing structure 702 comprises a first subtree 732 and a second subtree 734, where a given branch point candidate 740 is associated with a current level of the routing structure 702, the branch point 742 represents a branch point selected at a previous level of the routing structure 702 for the first subtree 732, and the branch point 744 represents a branch point selected at a previous level of the routing structure 702 for the second subtree 734. As shown, compared to the first subtree 712 and the second subtree 714 of the routing structure 700, the first subtree 732 and the second subtree 734 resulting in the routing structure 702 are adjusted from their ideal locations (e.g., shifted by a small amount from ideal locations), thereby avoiding (or resolving) the resource conflicts (726, 728) of the routing structure 700.

Figure 8:
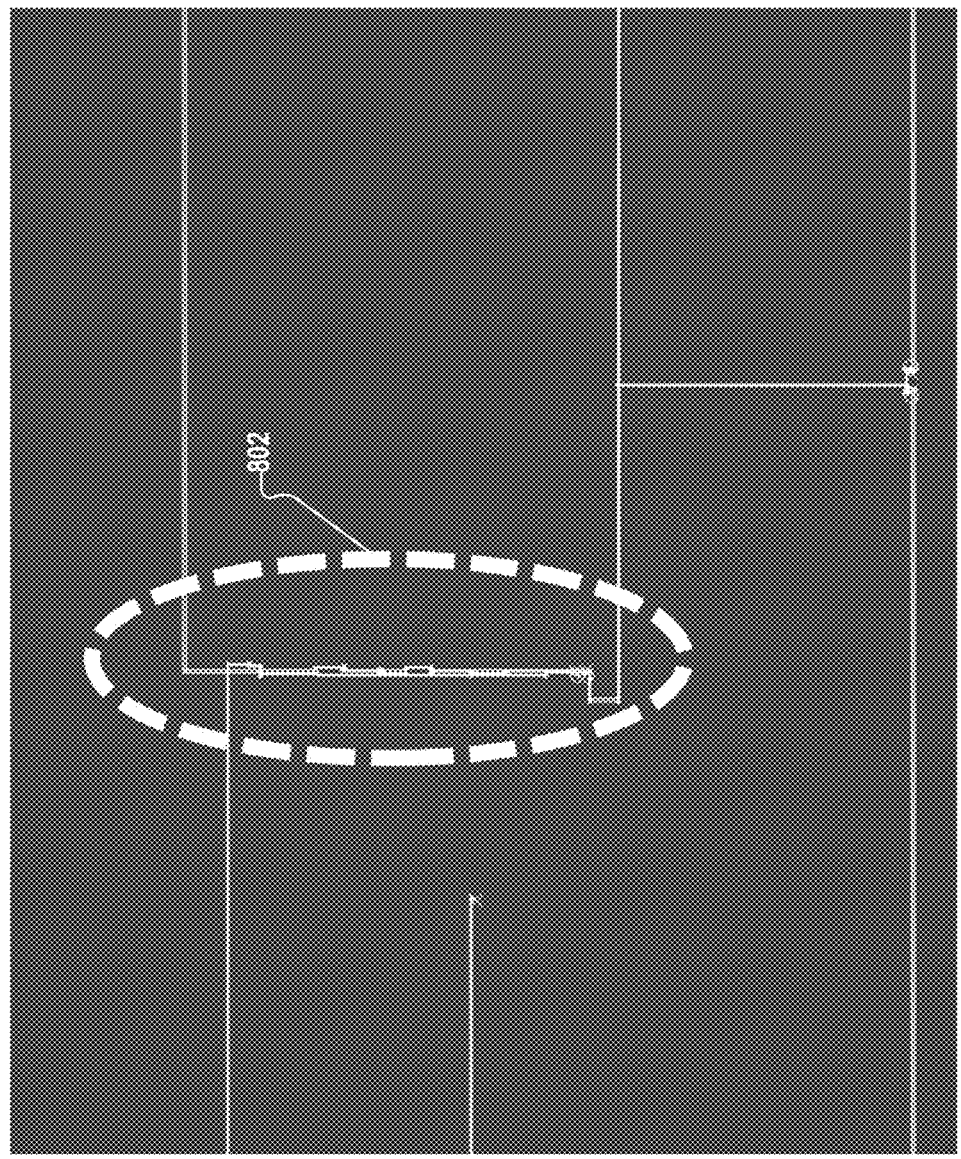
FIG. 8 is schematic illustrating a portion of an example routing structure for a clock network generated by a traditional methodology.

FIG. 8 is schematic illustrating a portion 800 of an example routing structure for a clock network generated by a traditional methodology. The portion 800 can represent, for example, a portion of a subtree of a clock tree. As shown by section 802 (of the portion 800), the traditional methodology for generating the portion 800 uses local detours of routes to address resource conflicts (e.g., avoid edge intersection within a single subtree or between different subtrees), which results in jogging of the wire. The jogging of the wire can increase the wirelength of the routing structure for the clock network and can cause an imbalance in the electrical properties of the routing structure (e.g., due to the insertion of via and use of routing layers with different electrical properties).

Figure 9:
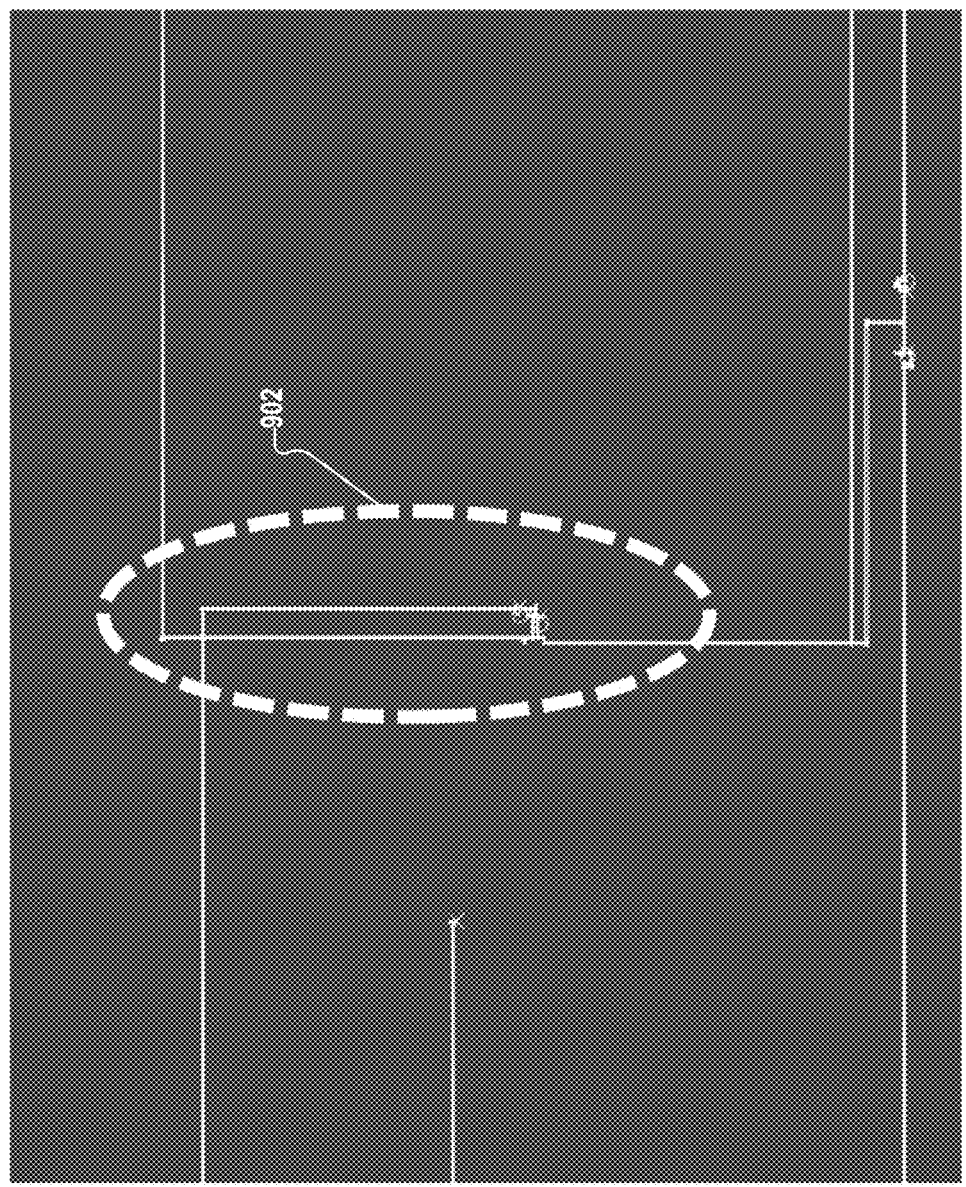
FIG. 9 is schematic illustrating a portion of an example routing structure for a clock network generated based on edge intersection detection, according to some embodiments.

FIG. 9 is schematic illustrating a portion 900 of an example routing structure for a clock network generated based on edge intersection detection, according to some embodiments. In particular, the portion 900 corresponds to the same portion of the example routing structure as the portion 800 described above with respect to FIG. 8. However, unlike the portion 800, section 902 (of the portion 900) illustrates how an embodiment described herein can generate the example routing structure based on edge intersection detection and, which obviates the need to use traditional solutions (e.g., local detours of routes) to address resource conflicts (e.g., avoid edge intersection within a single subtree or between different subtrees), which can result in jogging of routes and increased wirelength within the routing structure for the clock network.

Figure 10:
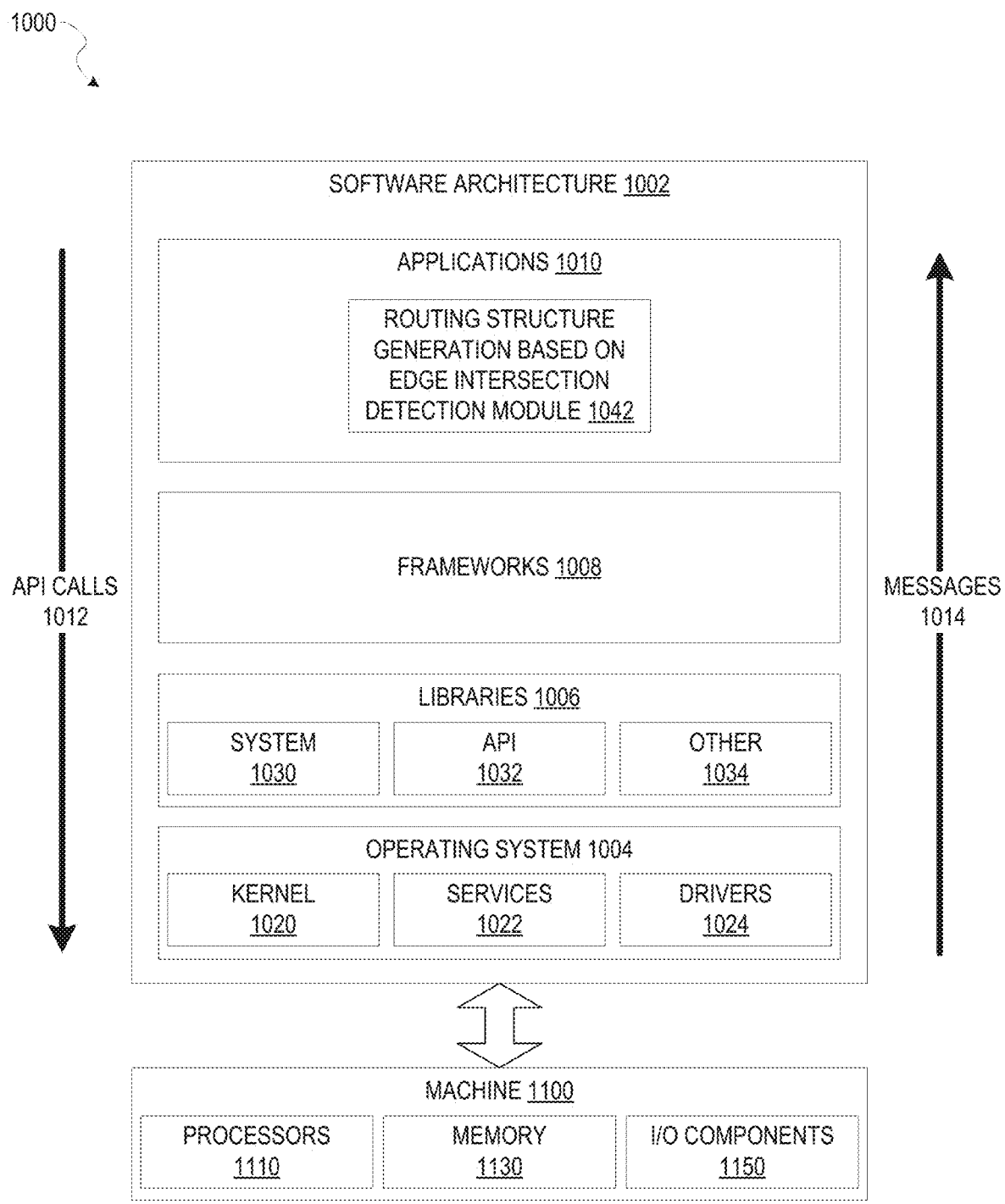
FIG. 10 is a block diagram illustrating an example of a software architecture that may be operating on an EDA computing device and may be used with methods for generating a routing structure for a clock network based on edge intersection detection, according to some embodiments.

FIG. 10 is a block diagram 1000 illustrating an example of a software architecture 1002 that may be operating on an EDA computer and may be used with methods for generating a routing structure for a clock network based on edge intersection detection, according to some embodiments. The software architecture 1002 can be used as an EDA computing device to implement any of the methods described above. Aspects of the software architecture 1002 may, in various embodiments, be used to store circuit designs, and to facilitate generation of a circuit design in an EDA environment by generation of a routing structure for a clock network based on edge intersection detection, from which physical devices may be generated.

FIG. 10 is merely a non-limiting example of a software architecture 1002, and it will be appreciated that many other architectures can be implemented to facilitate the functionality described herein. In various embodiments, the software architecture 1002 is implemented by hardware such as a machine 1100 of FIG. 11 that includes processors 1110 (e.g., hardware processors), memory 1130, and input/output (I/O) components 1150. In this example, the software architecture 1002 can be conceptualized as a stack of layers where each layer may provide a particular functionality. For example, the software architecture 1002 includes layers such as an operating system 1004, libraries 1006, software frameworks 1008, and applications 1010. Operationally, the applications 1010 invoke application programming interface (API) calls 1012 through the software stack and receive messages 1014 in response to the API calls 1012, consistent with some embodiments. In various embodiments, any client device, any server computer of a server system, or any other device described herein may operate using elements of the software architecture 1002. An EDA computing device described herein may additionally be implemented using aspects of the software architecture 1002, with the software architecture 1002 adapted for operating (clock network) routing structure generation in any manner described herein.

In some embodiments, an EDA application of the applications 1010 performs generation of a routing structure for a clock network of a circuit design based on edge intersection detection according to embodiments described herein using various modules within the software architecture 1002. For example, in some embodiments, an EDA computing device similar to the machine 1100 includes the memory 1130 and the one or more processors 1110. The processors 1110 also implement a routing structure generation based on edge intersection detection module 1042 (hereafter, the routing structure generation module 1042) for generating a routing structure for a clock network based on edge intersection detection, in accordance with various embodiments described herein.

In various other embodiments, rather than being implemented as modules of the one or more applications 1010, the routing structure generation module 1042 may be implemented using elements of the libraries 1006, the operating system 1004, or the software frameworks 1008.

In various implementations, the operating system 1004 manages hardware resources and provides common services. The operating system 1004 includes, for example, a kernel 1020, services 1022, and drivers 1024. The kernel 1020 acts as an abstraction layer between the hardware and the other software layers, consistent with some embodiments. For example, the kernel 1020 provides memory management, processor management (e.g., scheduling), component management, networking, and security settings, among other functionality. The services 1022 can provide other common services for the other software layers. The drivers 1024 are responsible for controlling or interfacing with the underlying hardware, according to some embodiments. For instance, the drivers 1024 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 1006 provide a low-level common infrastructure utilized by the applications 1010. The libraries 1006 can include system libraries 1030 such as libraries of blocks for use in an EDA environment or other libraries that can provide functions such as memory allocation functions, string manipulation functions, mathematic functions, and the like. In addition, the libraries 1006 can include API libraries 1032 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in 2D and 3D in a graphic context on a display), database libraries (e.g., SQLite to provide various relational database functions), web libraries (e.g., WebKit to provide web browsing functionality), and the like. The libraries 1006 may also include other libraries 1034.

The software frameworks 1008 provide a high-level common infrastructure that can be utilized by the applications 1010, according to some embodiments. For example, the software frameworks 1008 provide various graphic user interface (GUI) functions, high-level resource management, high-level location services, and so forth. The software frameworks 1008 can provide a broad spectrum of other APIs that can be utilized by the applications 1010, some of which may be specific to a particular operating system 1004 or platform. In various embodiments, the systems, methods, devices, and instructions described herein may use various files, macros, libraries, and other elements of an EDA design environment to implement generation of a routing structure for a clock network of a circuit design based on edge intersection detection as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 1002, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose hardware processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 1100 including processors 1110), with these operations being accessible via a network (e.g., the Internet) and via one or more appropriate interfaces (e.g., an API). In certain embodiments, for example, a client device may relay or operate in communication with cloud computing systems and may access circuit design information in a cloud environment.

The performance of certain of the operations may be distributed among the processors, not only residing within a single machine 1100, but deployed across a number of machines 1100. In some embodiments, the processors 1110 or processor-implemented modules are located in a single geographic location (e.g., within a home environment, an office environment, or a server farm). In some other embodiments, the processors or processor-implemented modules are distributed across a number of geographic locations.

Figure 11:
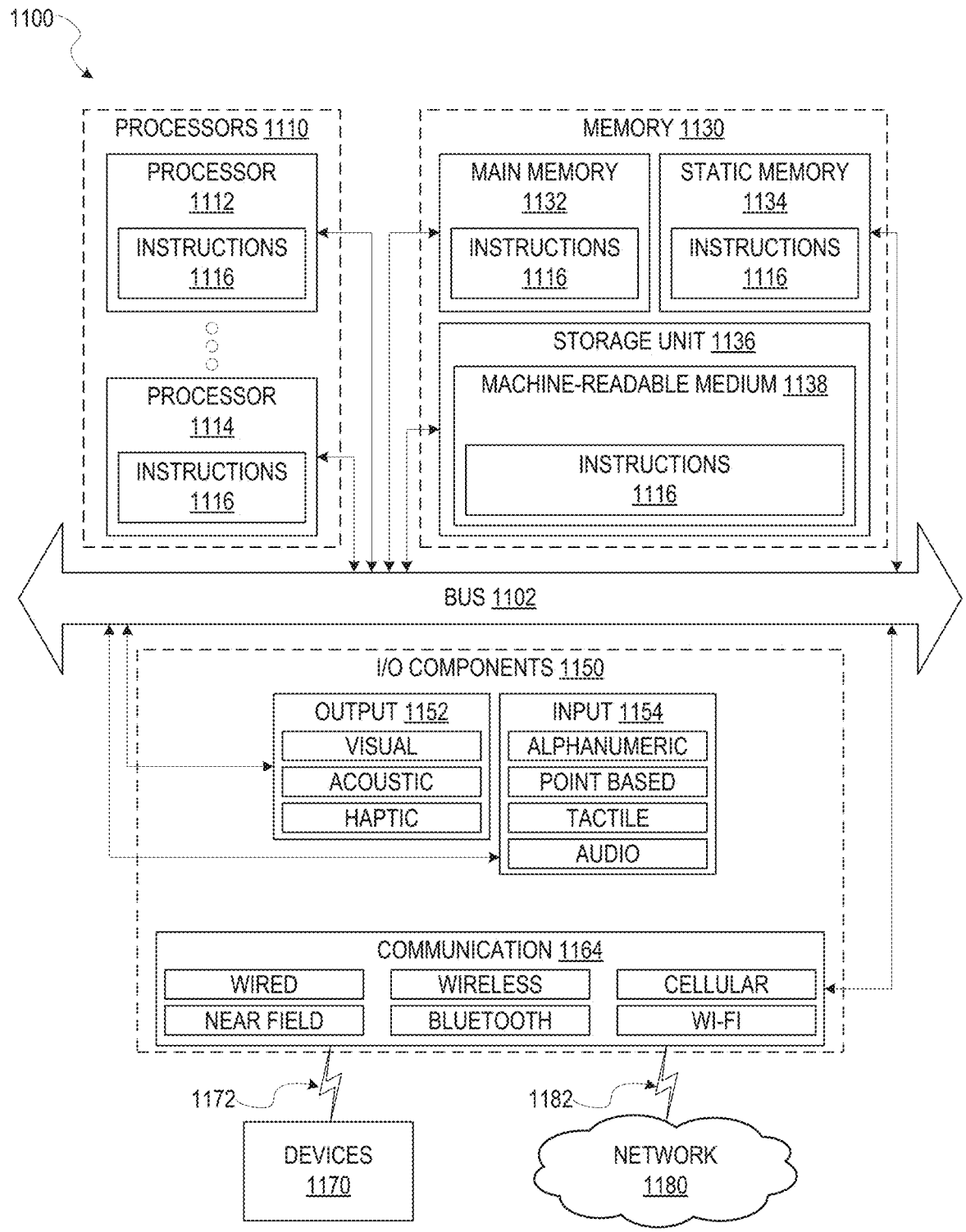
FIG. 11 is a diagram representing a machine in the form of a computer system within which a set of instructions are executed, causing the machine to perform any one or more of the methods discussed herein, according to some embodiments.

FIG. 11 is a diagrammatic representation of the machine 1100 in the form of a computer system within which a set of instructions may be executed for causing the machine 1100 to perform any one or more of the methodologies discussed herein, according to some embodiments. FIG. 11 shows components of the machine 1100, which is, according to some embodiments, able to read instructions from a machine-readable medium (e.g., a machine-readable storage medium) and perform any one or more of the methodologies discussed herein. Specifically, FIG. 11 shows a diagrammatic representation of the machine 1100 in the example form of a computer system, within which instructions 1116 (e.g., software, a program, an application, an applet, an app, or other executable code) for causing the machine 1100 to perform any one or more of the methodologies discussed herein can be executed. In alternative embodiments, the machine 1100 operates as a standalone device or can be coupled (e.g., networked) to other machines. In a networked deployment, the machine 1100 may operate in the capacity of a server machine or a client machine in a server-client network environment, or as a peer machine in a peer-to-peer (or distributed) network environment. The machine 1100 can comprise, but not be limited to, a server computer, a client computer, a personal computer (PC), a tablet computer, a laptop computer, a netbook, or any machine capable of executing the instructions 1116, sequentially or otherwise, that specify actions to be taken by the machine 1100.

Further, while only a single machine 1100 is illustrated, the term "machine" shall also be taken to include a collection of machines 1100 that individually or jointly execute the instructions 1116 to perform any one or more of the methodologies discussed herein.

In various embodiments, the machine 1100 comprises processors 1110, memory 1130, and I/O components 1150, which can be configured to communicate with each other via a bus 1102. In some embodiments, the processors 1110 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another, or any suitable combination thereof) include, for example, a processor 1112 and a processor 1114 that may execute the instructions 1116. The term "processor" is intended to include multi-core processors 1110 that may comprise two or more independent processors 1112, 1114 (also referred to as "cores") that can execute the instructions 1116 contemporaneously. Although FIG. 11 shows multiple processors 1110, the machine 1100 may include a single processor 1112 with a single core, a single processor 1112 with multiple cores (e.g., a multi-core processor 1112), multiple processors 1110 with a single core, multiple processors 1110 with multiple cores, or any combination thereof.

The memory 1130 comprises a main memory 1132, a static memory 1134, and a storage unit 1136 accessible to the processors 1110 via the bus 1102, according to some embodiments. The storage unit 1136 can include a machine-readable medium 1138 on which are stored the instructions 1116 embodying any one or more of the methodologies or functions described herein. The instructions 1116 can also reside, completely or at least partially, within the main memory 1132, within the static memory 1134, within at least one of the processors 1110 (e.g., within the processor's cache memory), or any suitable combination thereof, during execution thereof by the machine 1100. Accordingly, in various embodiments, the main memory 1132, the static memory 1134, and the processors 1110 are considered machine-readable media 1138.

As used herein, the term "memory" refers to a machine-readable medium 1138 able to store data temporarily or permanently and may be taken to include, but not be limited to, random-access memory (RAM), read-only memory (ROM), buffer memory, flash memory, and cache memory. While the machine-readable medium 1138 is shown, in some embodiments, to be a single medium, the term "machine-readable medium" should be taken to include a single medium or multiple media (e.g., a centralized or distributed database, or associated caches and servers) able to store the instructions 1116. The term "machine-readable medium" shall also be taken to include any medium, or combination of multiple media, that is capable of storing instructions (e.g., the instructions 1116) for execution by a machine (e.g., the machine 1100), such that the instructions, when executed by one or more processors of the machine (e.g., the processors 1110), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 1150 include a wide variety of components to receive input, provide output, produce output, transmit information, exchange information, capture measurements, and so on. In general, it will be appreciated that the I/O components 1150 can include many other components that are not shown in FIG. 11. The I/O components 1150 are grouped according to functionality merely for simplifying the following discussion, and the grouping is in no way limiting. In various embodiments, the I/O components 1150 include output components 1152 and input components 1154. The output components 1152 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 1154 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 1150 may include communication components 1164 operable to couple the machine 1100 to a network 1180 or devices 1170 via a coupling 1182 and a coupling 1172, respectively. For example, the communication components 1164 include a network interface component or another suitable device to interface with the network 1180. In further examples, the communication components 1164 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 1170 may be another machine or any of a wide variety of peripheral devices (e.g., a peripheral device coupled via a USB).

In various embodiments, one or more portions of the network 1180 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 1180 or a portion of the network 1180 may include a wireless or cellular network, and the coupling 1182 may be a Code Division Multiple Access (CDMA) connection, a Global System for Mobile communications (GSM) connection, or another type of cellular or wireless coupling.

Furthermore, the machine-readable medium 1138 is non-transitory (in other words, not having any transitory signals) in that it does not embody a propagating signal. However, labeling the machine-readable medium 1138 "non-transitory" should not be construed to mean that the machine-readable medium 1138 is incapable of movement; the machine-readable medium 1138 should be considered as being transportable from one physical location to another. Additionally, since the machine-readable medium 1138 is tangible, the machine-readable medium 1138 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to some embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A method comprising:
accessing, by a hardware processor, circuit design data that describes a clock source and a plurality of clock sinks for a circuit design;
determining, by the hardware processor, a first set of branch point candidates for a first level of a routing structure for a clock network by performing a first bottom-up wavefront analysis on each clock sink in the plurality of clock sinks;
determining, by the hardware processor, a first set of branch points based on the first set of branch point candidates, the determining the first set of branch points comprising applying a branch point cost function to the first set of branch point candidates, the applying the branch point cost function to the first set of branch point candidates comprising adjusting a cost of a given branch point candidate, in the first set of branch point candidates, based on edge intersection detection;
generating, by the hardware processor, a portion of the routing structure between the clock source and the plurality of clock sinks via at least the first set of branch points; and
generating, by the hardware processor, an updated circuit design based on at least the portion of the routing structure.

2. The method of claim 1, wherein the routing structure comprises a clock tree.

3. The method of claim 2, wherein the clock tree comprises an H-tree.

4. The method of claim 1, wherein the adjusting the cost of the given branch point candidate, in the first set of branch point candidates, based on edge intersection detection comprises:
detecting for at least one edge intersection in a first substructure of the routing structure coupled to the given branch point candidate; and
in response to detecting the at least one edge intersection in the first substructure, adjusting the cost of the given branch point candidate.

5. The method of claim 4, wherein the routing structure comprises a clock tree, and the first substructure comprises a first subtree.

6. The method of claim 4, wherein the detecting for the edge intersection in the first substructure coupled to the given branch point candidate comprises:
determining a set of edges for the first substructure;
sorting the set of edges; and
based on the sorted set of edges, detecting for a set of edge intersections in the first substructure.

7. The method of claim 4, wherein the detecting for the edge intersection in the first substructure coupled to the given branch point candidate comprises:
determining a set of edges for the first substructure by extracting edge data from wavefront data, the wavefront data being generated by the performing the first bottom-up wavefront analysis on each clock sink in the plurality of clock sinks.

8. The method of claim 7, wherein the wavefront data comprises data regarding one or more connections between edges at routing turns.

9. The method of claim 7, wherein the wavefront data comprises data regarding one or more connections to branch points.

10. The method of claim 4, wherein the adjusting the cost of the given branch point candidate comprises:
increasing the cost of the given branch point candidate according to a high cost component.

11. The method of claim 1, wherein the adjusting the cost of the given branch point candidate, in the first set of branch point candidates, based on edge intersection detection comprises:
detecting for at least one edge intersection in a first substructure of the routing structure coupled to the given branch point candidate; and
in response to not detecting the at least one edge intersection in the first substructure, detecting for at least one edge intersection in a second substructure of the routing structure coupled to the given branch point candidate.

12. The method of claim 11, wherein the adjusting the cost of the given branch point candidate, in the first set of branch point candidates, based on edge intersection detection further comprises:
in response to detecting the at least one edge intersection in the second substructure, adjusting the cost of the given branch point candidate.

13. The method of claim 11, wherein the adjusting the cost of the given branch point candidate, in the first set of branch point candidates, based on edge intersection detection further comprises:
in response to not detecting the at least one edge intersection in the second substructure, detecting for at least one edge intersection between an edge of the first substructure and an edge of the second substructure.

14. The method of claim 13, wherein the adjusting the cost of the given branch point candidate, in the first set of branch point candidates, based on edge intersection detection further comprises:
in response to detecting the at least one edge intersection between the edge of the first substructure and the edge of the second substructure, adjusting the cost of the given branch point candidate.

15. The method of claim 1, further comprising:
determining, by the hardware processor, a second set of branch point candidates for a second level of the routing structure by performing a second bottom-up wavefront analysis on each branch point in the first set of branch points; and
determining, by the hardware processor, a second set of branch points based on the second set of branch point candidates, the determining the second set of branch points comprising applying the branch point cost function to the second set of branch point candidates, the applying the branch point cost function to the second set of branch point candidates comprising adjusting a cost of another given branch point candidate, in the second set of branch point candidates, based on edge intersection detection.

16. The method of claim 1, wherein the applying the branch point cost function to the first set of branch point candidates further comprises:
  determining whether any other cost component being considered by the branch point cost function for the given branch point candidate is low in view of an efficiency threshold, wherein the adjusting the cost of the given branch point candidate based on edge intersection detection is performed in response to determining that any other cost component being considered by the branch point cost function for the given branch point candidate is low in view of the efficiency threshold.

17. A device comprising:
  a memory storing instructions; and
  a hardware processor communicatively coupled to the memory and configured by the instructions to perform operations comprising:
    accessing circuit design data that describes a clock source and a plurality of clock sinks for a circuit design;
    performing an initial bottom-up wavefront analysis on each clock sink in the plurality of clock sinks to determine an initial set of branch point candidates for an initial level of a routing structure for a clock network;
    determining an initial set of branch points based on the initial set of branch point candidates, the determining the initial set of branch points comprising applying a branch point cost function to the initial set of branch point candidates, the applying the branch point cost function to the initial set of branch point candidates comprising adjusting a cost of a given branch point candidate, in the initial set of branch point candidates, based on edge intersection detection;
    for each subsequent level of the routing structure until a top level of the routing structure is reached:
      performing a subsequent bottom-up wavefront analysis on each branch point in a set of branch points determined for a previous level of the routing structure to determine a subsequent set of branch point candidates for the subsequent level; and
      determining a subsequent set of branch points based on the subsequent set of branch point candidates, the determining the subsequent set of branch points comprising applying the branch point cost function to the subsequent set of branch point candidates, the applying the branch point cost function to the subsequent set of branch point candidates comprising adjusting a cost of another given branch point candidate, in the subsequent set of branch point candidates, based on edge intersection detection; and
    generating a portion of the routing structure between the clock source and the plurality of clock sinks via at least the initial set of branch points and the subsequent set of branch points.

18. The device of claim 17, wherein the routing structure comprises an H-tree.

19. A non-transitory computer-readable medium comprising instructions that, when executed by a hardware processor of a device, cause the device to perform operations comprising:
  accessing circuit design data that describes a clock source and a plurality of clock sinks for a circuit design;
  determining a first set of branch point candidates for a first level of a routing structure for a clock network by performing a first bottom-up wavefront analysis on each clock sink in the plurality of clock sinks;
  determining a first set of branch points based on the first set of branch point candidates, the determining the first set of branch points comprising applying a branch point cost function to the first set of branch point candidates, the applying the branch point cost function to the first set of branch point candidates comprising:
    detecting for at least one intersection in a first substructure of the routing structure coupled to a given branch point candidate the first set of branch point candidates; and
    in response to detecting the at least one intersection in the first substructure, adjusting the cost of the given branch point candidate; and
  generating a portion of the routing structure between the clock source and the plurality of clock sinks via at least the first set of branch points.

20. The non-transitory computer-readable medium of claim 19, wherein the at least one intersection comprises a rectangle-based intersection.

* * * * *